United States Patent [19]

Hahn et al.

[11] Patent Number: 4,539,683

[45] Date of Patent: Sep. 3, 1985

[54] METHOD AND APPARATUS FOR CHECKING ANALOG-TO-DIGITAL CONVERTERS, DIGITAL-TO-ANALOG CONVERTERS, OR TELECOMMUNICATIONS TRANSMISSION LINKS WHICH CONTAIN SUCH CONVERTERS

[75] Inventors: Helmuth Hahn, Hohenschaftlarn; Werner Cordt; Winfried Borm, both of Munich, all of Fed. Rep. of Germany

[73] Assignee: Siemens Aktiengesellschaft, Berlin and Munich, Fed. Rep. of Germany

[21] Appl. No.: 474,636

[22] PCT Filed: Jul. 8, 1982

[86] PCT No.: PCT/DE82/00143

§ 371 Date: Feb. 16, 1983

§ 102(e) Date: Feb. 16, 1983

[87] PCT Pub. No.: WO83/00231

PCT Pub. Date: Jan. 20, 1983

[30] Foreign Application Priority Data

Jul. 8, 1981 [DE] Fed. Rep. of Germany ....... 3126939
May 13, 1982 [DE] Fed. Rep. of Germany ....... 3218066

[51] Int. Cl.$^3$ .............................................. G06F 11/00
[52] U.S. Cl. ........................................ 371/15; 371/25
[58] Field of Search ................ 371/15, 25, 20, 22; 364/553; 340/347 CC

[56] References Cited

U.S. PATENT DOCUMENTS

| 3,931,506 | 1/1976 | Borrelli et al. | 371/20 |
| 4,266,292 | 5/1981 | Regan et al. | 371/25 |
| 4,335,373 | 6/1982 | Sloane | 371/15 |
| 4,352,160 | 9/1982 | Frech et al. | 364/553 |
| 4,354,177 | 10/1982 | Sloane | 371/25 |
| 4,419,656 | 12/1983 | Sloane | 371/25 |
| 4,465,995 | 8/1984 | Sloane | 371/15 |

FOREIGN PATENT DOCUMENTS 2503974 8/1976 Fed. Rep. of Germany.
2804951 8/1979 Fed. Rep. of Germany.

OTHER PUBLICATIONS

Technisches Messen, vol. 48, No. 10, Oct. 1981, Muenchen; R. Fritz, H. Holzl and U. Kemmer: "Test von Analog/Digital-Umsetzern mit Hilfe eines Logik-Analysators", pp. 333-337.

Elektronik, Issue 27, No. 4, Apr. 1978, G. Pretzl: "Die Prufung des Dynamischen Verhaltens Schneller A/D-Umsetzer", pp. 97-101.

Elektronik, vol. 24, No. 12, Dec. 1975, R. Gossler: "Prufmethoden fur A/D-Umsetzer", pp. 56-60.

Elektronik, vol. 28, No. 20, Oct. 1979, M. Zimmer: "Testen Schneller Analog/Digital-Umsetzer mit Tischrechnern", pp. 61-66.

Radio Fernsehen Elektronik, Issue 27, No. 7, Jul. 1978, B. Schildwach u.a.: "Abgleich und Prufung von Analog-Digital-und Digital-Analog-Umsetzern", pp. 425-427.

The Radio and Electronic Engineer, vol. 50, No. 7, Jul. 1980, London, (GB), R. G. Rolls: "A Review of Distortion and Its Measurement in p—c—m—Telephony Systems", pp. 353-362.

Frequenz, vol. 28, No. 10, Oct. 1974, H. Freytag: "Messgerate fur PCM—Digital—Ubertragungssysteme", pp. 270-274.

Primary Examiner—Jerry Smith
Assistant Examiner—Michael R. Fleming
Attorney, Agent, or Firm—Hill, Van Santen, Steadman & Simpson

[57] ABSTRACT

The test specimen is charged with an analog, preferably sinusoidal periodic test signal or, respectively, with the digital samples of such a test signal, whereby a numerical relationship exists between the period of the test signal and the system-inherent sampling period such that all sampling times lying within a predetermined test time span occupy different relative time slots in the periodicity interval of the test signal. Arising as a result thereof are a plurality of output information of the test specimen which, as a totality, describe the response of the test specimen to the test signal as precisely as desired. Said output information are, if need be after analog-to-digital conversion in a standard coder, deposited in a store and are available for identifying the desired properties of the test specimen, for example, the level-dependent distortions, by means of a computer.

18 Claims, 13 Drawing Figures

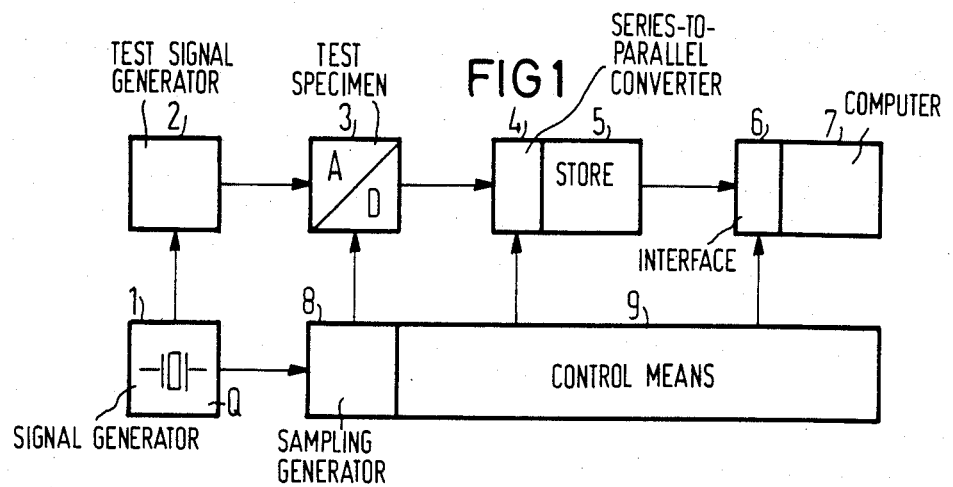
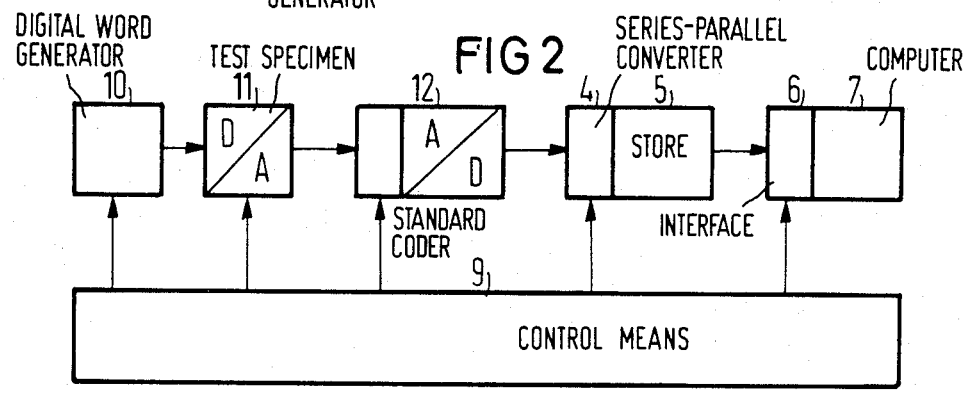
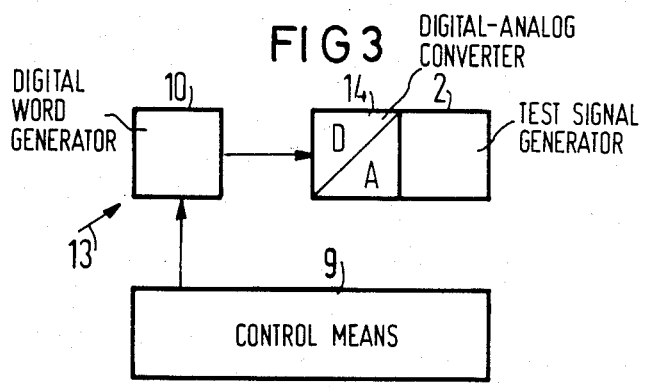

METHOD AND APPARATUS FOR CHECKING ANALOG-TO-DIGITAL CONVERTERS, DIGITAL-TO-ANALOG CONVERTERS, OR TELECOMMUNICATIONS TRANSMISSION LINKS WHICH CONTAIN SUCH CONVERTERS

BACKGROUND OF THE INVENTION

The invention relates to a method and device for checking test specimens comprising digital-to-analog converters and/or analog-to-digital converters or telecommunications transmission links which contain such converters or are connected in series thereto.

The known advantages of digital message transmission and switching, regenerability of the signals as desired, the possibility of processing and editing them by means of modern computer technology, as well as the availability of highly developed and economical digital modules and also including the significant structural simplification of telecommunications systems have led to the universally observable introduction of digital message systems. The recent availability of extremely broad-band transmission channels in the form of light waveguides accommodates the tendency toward digitization of the electrical message industry.

Since the original information in most cases, for example in telephone technology and in image transmission of half-tone masters, are analog values, they must be converted into digital signals with the assistance of suitable matching devices. These matching devices, which must carry out the analog-to-digital conversion at the inputs of the systems and the digital-to-analog conversion at their outputs, are presently the most problematical modules of the digital communications system. This pertains both to their function as well as to the device-oriented expense embodied by them within a system, making up approximately half of the overall hardware expense in, for example, digital telephone switching systems. It is obvious that every advance in the development and manufacture of cost-favorable converter modules which meet the strict demands raised has a positive influence on the economic feasibility of the overall system.

Checking the analog-to-digital and/or digital-to-analog converter generally realized as micro-electronic circuits or, respectively, the modules containing said converters is accorded special significance for these reasons. The checking should provide not only precise information concerning the qualification of the respectively tested specimen but, rather, should also provide conclusions concerning systematic manufacturing deficiencies.

Checking digital converter modules with the assistance of traditional transmission test positions requires comparatively long measuring and testing time which, among other things, depends on the transient response of the existing filters so that, in particular, measuring the quantization distortion is relatively involved.

Test installations are known ("Fairchild Telecom Test Adapter", Brochure 11/80 10 M 129000) and incorporated herein by reference wherein the signal samples gained by means of time-discrete sampling are subjected to a fast Fourier transformation and, by so doing, are transferred from the time range into the frequency range so that the spectral components are available for further investigation. The investigation of the signal samples ensues with suitable mathematical methods by means of a computer.

Other modern methods for checking converter modules are disclosed in the periodical "Der Elektroniker", 6-181, pages 56 through 58 in the article "An Integrated Analog/Digital Test System, 1981 Proceedings Electronic Components Conference", pp. 202–206; and "Real Time Measuring Method for CODEC Characteristics Using Digital Signal Processing", FUJITSU Scientific & Technical Journal, June 1981, pp. 15–33.

SUMMARY OF THE INVENTION

An object of the invention is to specify a method and apparatus for checking test specimens comprising analog-to-digital and/or digital-to-analog converters or telecommunications transmission links which contain such converters or are connected in series thereto, wherein the application of the aforementioned fast Fourier transformation can be eliminated so that the expense is reduced and the principal imprecisions are avoided. Further, with the assistance of a single test operation, the method according to the invention should enable as many measured values as desired to be gained, should shorten the time required for testing a specimen and should supply high precision.

The method according to the invention is characterized by generating a periodic test signal and selecting its period in comparison to a sampling period on which digitization is based such that all sampling times lying within a predetermined test time span extending over a plurality of periods of the test signal occupy different relative time slots within a period interval of the test signal. The test signal is supplied as an analog signal to the analog input or as a digitized signal to a digital input of the test specimen. At least a part of the digital words forming the output information of the test specimen or the digital words corresponding to analog output information of the test specimen and acquired with the assistance of the standard coder are deposited in the store. For the purpose of identifying interesting parameters, at least one part of the digital words deposited in the store is placed in relationship to actual amplitude values of the original test signal chronologically corresponding to the respective sampling values.

Advantageous developments of the method according to the invention as well as a device for executing said method are set forth in the various dependent claims of this application.

Although it is fundamentally possible given the inventive method to work with a single level setting which, for example, extends over the entire modulation range of the test specimen and with a single test frequency which meets the conditions specified in patent claim 1, it can be advantageous for examining specific quantization ranges and stages of interest to employ sinusoidal test signals with differing amplitudes.

The loading of the test specimen with the test signal whose frequency corresponds to the relationship specified in patent claim 1 supplies signal samples during the provided test time span which all correspond to different argument values of the test signal. These can be compiled into an imaging by means of suitable classification, said imaging corresponding to a so-to-speak "stroboscopic" representation of the response of the test specimen to the test signal. The method enables resolution which is as high as desired in the interesting modulation ranges, for example in the proximity of the zero passage. In contrast to known methods which make use of the fast Fourier transformation, the method according to the invention enables not only an overall description of the converter characteristic but its precise reconstruction as well. Since all measured values are provided in the steady state of the test specimen, there is no need to wait for transient periods of frequency-dependent components which may be present.

As mentioned, the inventive method enables a reconstruction of the actual transmission characteristic of the respective test specimen which is as precise as desired. The individual quantization stages of said transfer characteristic can be identified by means of simple regression calculation from the identified pairs of values (analog value and corresponding digital value). Advantageously, enough measured values are provided so that, for example, ten pairs of values are available for each quantization stage.

All interesting parameters of the test specimen, for example the level-dependent attenuation distortion and the level-dependent quantization distortion, can be identified with the assistance of the transfer characteristic determined from the measured values.

In general, the level-dependent attenuation distortion and the level-dependent quantization distortion will be determined for sinusoidal signals, since the fine structure of the corresponding curves enables a particularly precise analysis of the quality of the test specimen and of its weaknesses. However, it is also possible within the framework of the inventive method to calculate the level-dependent distortions for noise signals as well, so that comparability with other methods for distortion measurement is given.

The inventive method enables checking not only the actual converter but, rather, the transmission elements or links connected to it. Those can either be the filters connected to the actual converter or, respectively, not separately accessible or, on the other hand, can also be entire line sections or the like. The converters can either be checked in combination with such transmission links since the behavior of the overall arrangement consisting of the converter and, for example, line section, can be identified or, on the other hand, the properties of transmission links or, in general, of quadripoles per se can be identified when these are combined with a converter whose properties have previously been separately identified by the inventive method (master converter).

The periodic test voltage whose frequency in comparison to the sampling rate of the digital system is selected such that the samples—relative to the periodicity interval of the test voltage—all belong to different argument values so that their totality represents the response of the converter, can, fundamentally, have any desired chronological progression if it is merely guaranteed that all interesting excursion values (amplitudes) occur in it. Thus for example, a delta signal lies at hand, rising continuously up to a peak value corresponding, for example, to the modulation boundary of the test specimen. That a sinusoidal test signal is preferred in practice has, above all, two reasons: on the one hand, a sinusoidal signal can be realized with great precision over the required number of cycles; on the other hand, a sinusoidal signal can pass the frequency-dependent components, for example, filters, combined with the converter when it lies within the frequency band to be processed by the converter.

BRIEF DESCRIPTION OF THE DRAWINGS

Let the invention be explained in greater detail below on the basis of the drawings:

FIG. 1 shows the block diagram of an arrangement for measuring a test specimen in the analog-to-digital direction;

FIG. 2 shows the block diagram of an arrangement for measuring a test specimen in the digital-to-analog direction;

FIG. 3 shows the block diagram of an arrangement for generating a test signal with a defined frequency and phase position;

FIG. 7 the transfer characteristic of the test specimen;

FIG. 8 a section of the transfer characteristic according to FIG. 7 in an enlarged scale;

FIG. 9 an illustration of the digitized and decoded response of the test specimen to the sinusoidal test signal corresponding to the illustration according to FIG. 6;

FIG. 10 the level-dependent attenuation distortion given a sinusoidal signal;

FIG. 11 the level-dependent quantization distortion for a sinusoidal signal;

FIG. 12 the level-dependent attenuation distortion for a noise signal; and

FIG. 13 the level-dependent quantization distortion for a noise signal.

DESCRIPTION OF THE PREFERRED EMBODIMENTS

Figure 4:
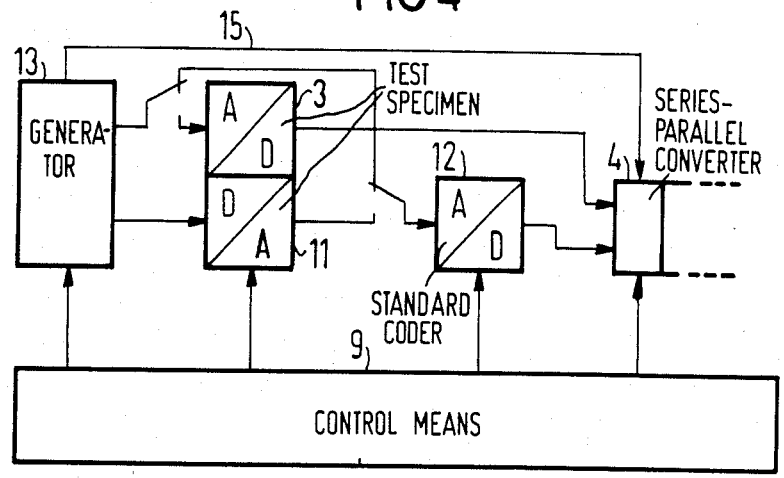
FIG. 4 shows the block diagram of an arrangement for measuring a test specimen in the analog-to-digital direction and vice versa.

The test installation illustrated in FIG. 1 contains a signal generator 1 controlled by a crystal Q for generating a signal with a prescribed frequency from which the actual test signal is derived in the test signal generator 2. The output of the signal generator 2 is connected to the analog input of the test specimen referenced 3. The digital output of the test specimen 3 is connected to a store over a series-to-parallel converter 4. Said store is connected with an interface 6 over which a computer 7 can be reached. In addition to the signal generator 2, the generator 1 also controls a further sampling generator 8 for generating the system sampling pulses as well as the control means referenced 9 for clock-suited drive of the series-parallel converter 4 and of the interface 6. As a result thereof, the synchronization of the test signal, test specimen and store is guaranteed.

The frequency of the signal generator 2 on the one hand and the clock frequency generated in the signal generator 8 on the other hand; and both derived from the crystal frequency, are selected such that all sampling times which lie within a test time span extending over a multitude of cycles of the test signal occupy different time slots relative to the periodicity interval of the test signal, i.e., that every sampling time corresponds to a different (precisely defined) argument value within the periodicity interval of the test signal. By so doing, as many signal samples as desired can be gained, their totality describing the behavior of the test specimen. The digital words corresponding to these signal samples are deposited in the store 5. They are thus available for further processing by the computer 7. For example, the signal samples can be classified according to their relative chronological position in the periodicity interval of the test signal and can be combined to form an "envelope" of the test signal, since the corresponding argument values (i.e., the time slot in the periodicity interval) are precisely known.

In a practical construction of a test installation for PCM codes (coder-decoder) with the system sampling frequency of 8 kHz, and a sampling cycle duration of 125 μs, the test signal exhibits a frequency of approximately 814 Hz. After litte more than one second, approximately 1000 oscillations therewith derive, these being respectively covered by approximately 10 sampling cycles. All signal samples exhibit different relative time slots in the periodicity interval of the test signal. As mentioned, the digital words corresponding to the samples are forwarded into the memory 5 over the series-parallel converter 4. The fixed and known allocation of frequency and phase position of the sampling and test signal enables an exact indication concerning the memory location at which the PCM words corresponding to the individual values of the response signal are situated.

Figure 5:
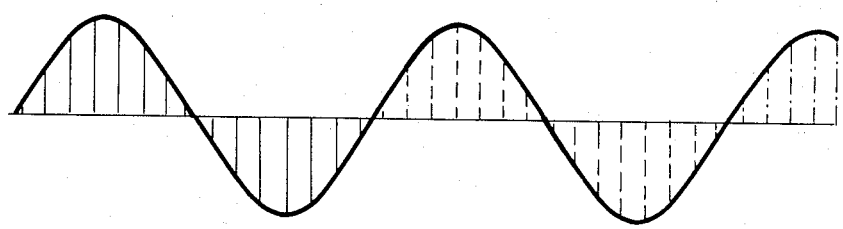
FIG. 5 schematically shows the chronological curve of some cycles of a test signal as well as the relative position of the sampling times.

The chronological position of the samples within different periods of the test signal is indicated in FIG. 5, whereby the samples in different periods are illustrated by different types of broken lines.

Figure 6:
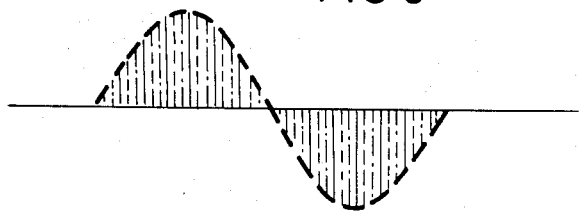
FIG. 6 shows an envelope curve of the response of the test specimen corresponding to the test signal created by means of combining the samples from FIG. 5 in proper time.
Figure 9:
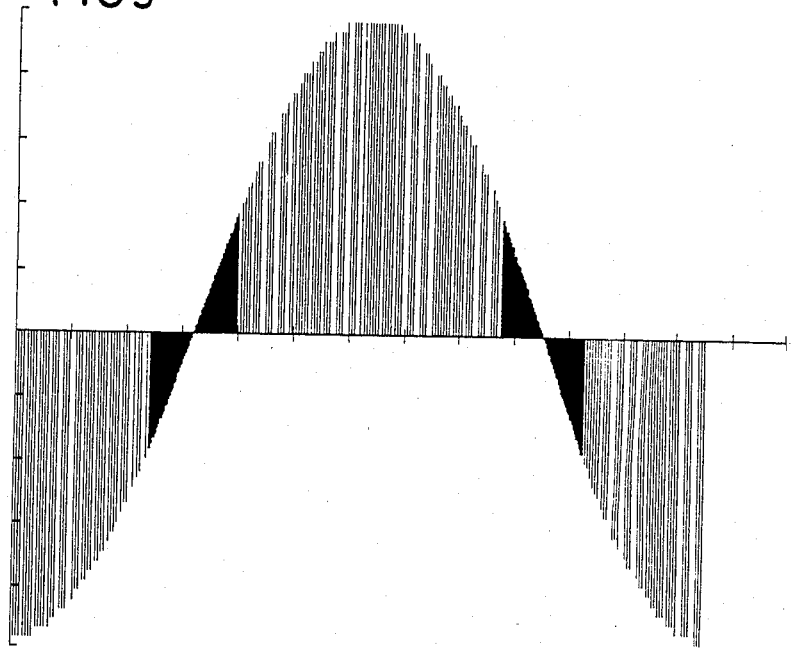

It can be seen from FIG. 6 how said samples which belong to different periods of the test signal are combined in a time-suited manner, i.e., with the argument value corresponding to them, to form the said envelope. To this end, the individual PCM words are read out of the store 5 by means of a suitable program and are sorted. FIG. 9 shows a diagram produced with the assistance of a plotter and corresponding to FIG. 6 which reproduces the response of a real codec to the sinusoidal test signal.

Figure 7:
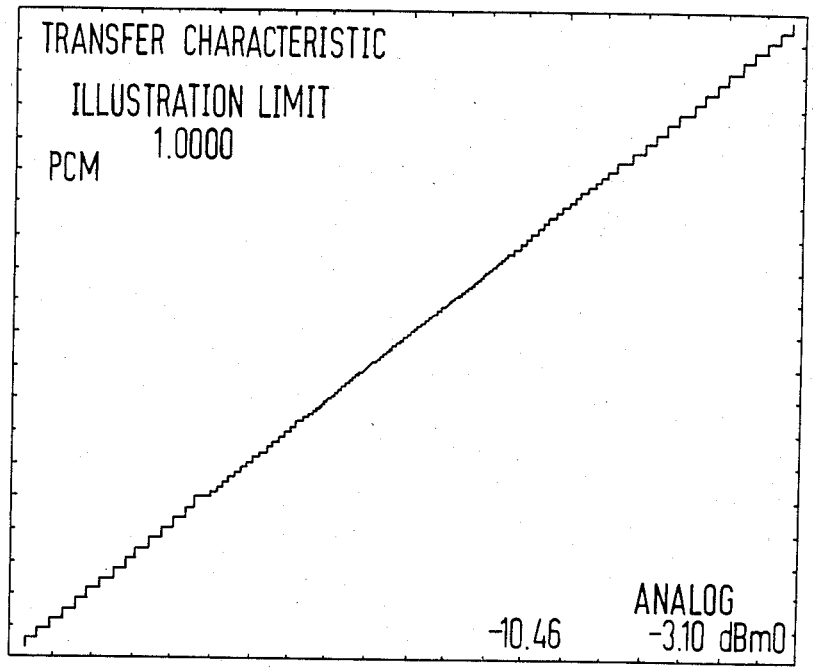
FIGS. 7 through 13 show curves and diagrams which were created for an analog-to-digital converter with the assistance of the inventive method. Shown in detail are.
Figure 8:
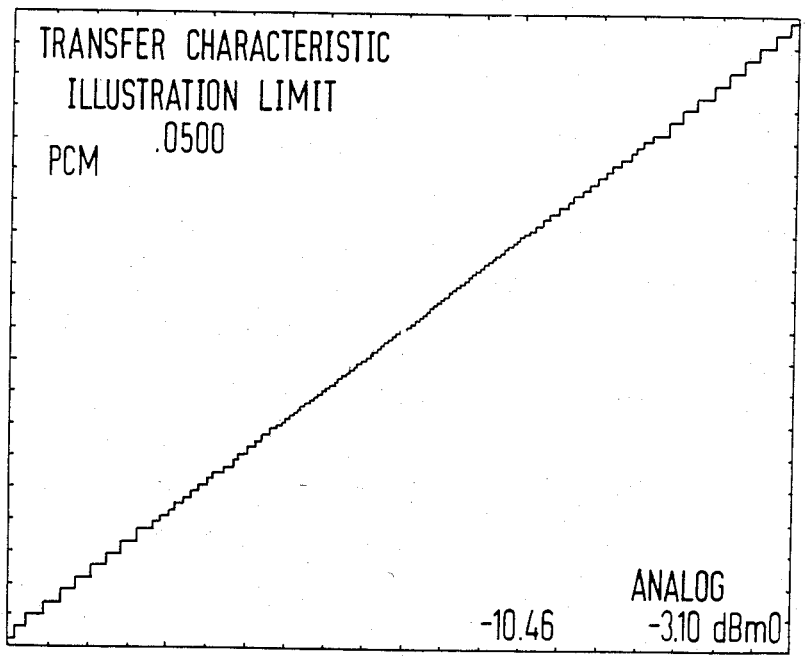

FIGS. 7 and 8 show the transfer characteristics of the codec likewise produced with the assistance of a plotter and identified from the allocation of the digital response signals to the samples of the test signal generated in the manner described above. The analog input signal of the test signal is entered on the abscissa axis, whereas the digital response signal is specified on the ordinate axis. FIG. 7 shows the transfer characteristic over the entire modulation range of the codec, whereas FIG. 8 illustrates a section enlarged twenty times. The different step size of the individual quantization intervals corresponds to the logarithmic companding characteristic (approximated by means of individual segments) of the analog-to-digital converter.

Since the chronological progression of the test signal emitted by the signal generator 2 and its mathematical description are precisely known, the computational treatment of the test values generated by the test specimen 3 which are deposited in the store 5 is very simple. By so doing, system-conditioned and specimen-conditioned fluctuations between the known test signal and the response of the test specimen, i.e. the coding behavior of the test specimen, can be quickly tested under operating-like conditions in the steady-state condition without—as in known methods—a problematic matching of comparators or the like being necessary. Deriving in particular because of the fixed allocation of the test values to the original signals are simpler computational rules, a lower plurality of computational steps, more precise results, and significantly shorter computation times than in known test methods.

Figure 10:
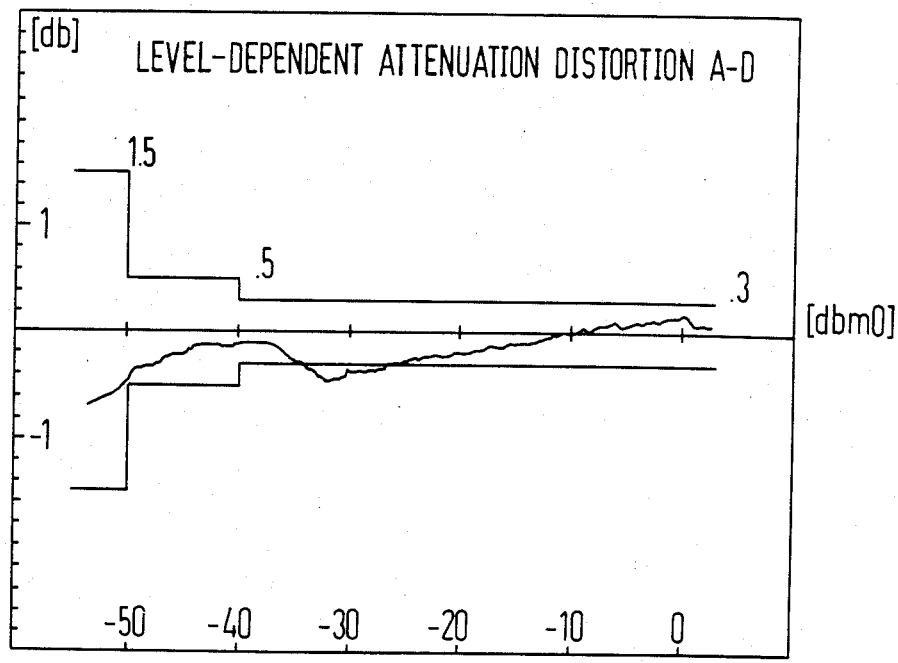

In a standardized illustration, FIG. 10 shows the level-dependent attenuation distortion of a codec in the analog-to-digital direction for sinusoidal signals. The drawing was again produced with the assistance of a plotter. The step-shaped curves entered with solid lines illustrate the tolerance limits. It can be seen that the attenuation distortion of the measured test specimen in the level range from approximately −30 dbmO lies outside of the permissible tolerance range.

It is also to be pointed out that, in the identification of the level-dependent attenuation distortion, the "decision thresholds" given the inventive method can be separately evaluated both in the range of the positive as well as of the negative half wave. The illustrated curve, for example, corresponds to the positive half waves of the test signal. If one were also to enter the values corresponding to the negative half waves, one would additionally obtain a curve which corresponds to a mirror image of the illustrated curve at the ordinate axis in case the test specimen functions completely "symmetrically".

Figure 11:
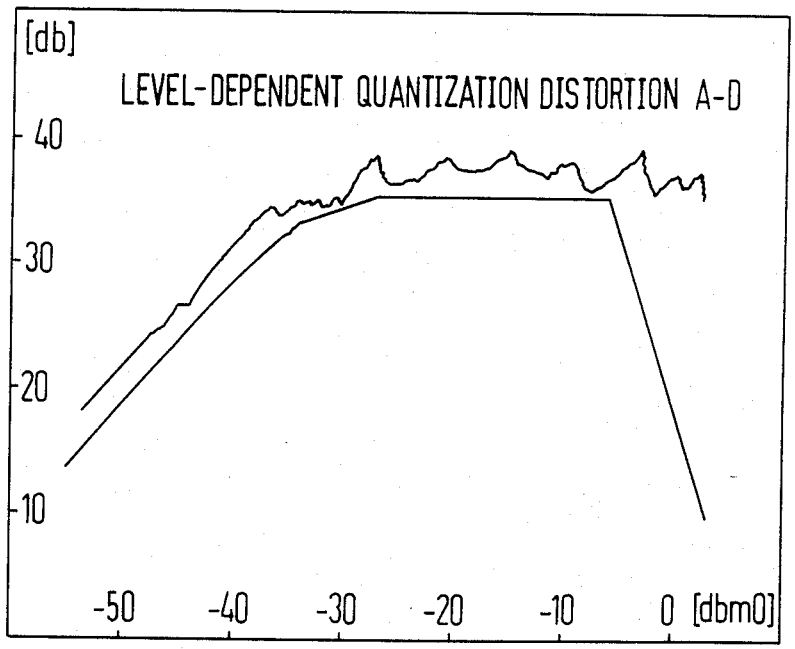

FIG. 11 shows the level-dependent quantization distortion of the same codec, again in the analog-to-digital direction. Thereby, the codec is again charged with a sinusoidal input signal.

Figure 12:
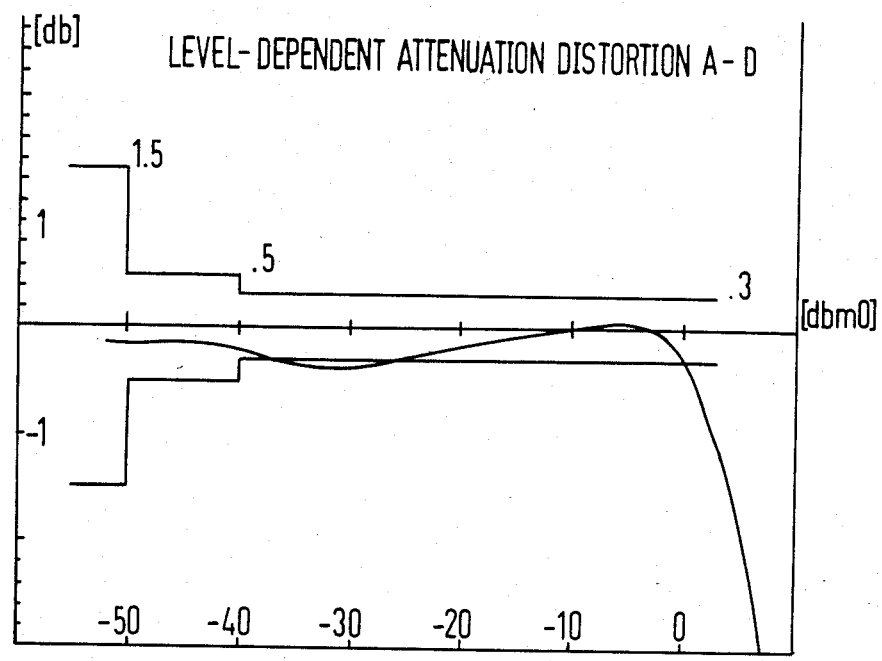
Figure 13:
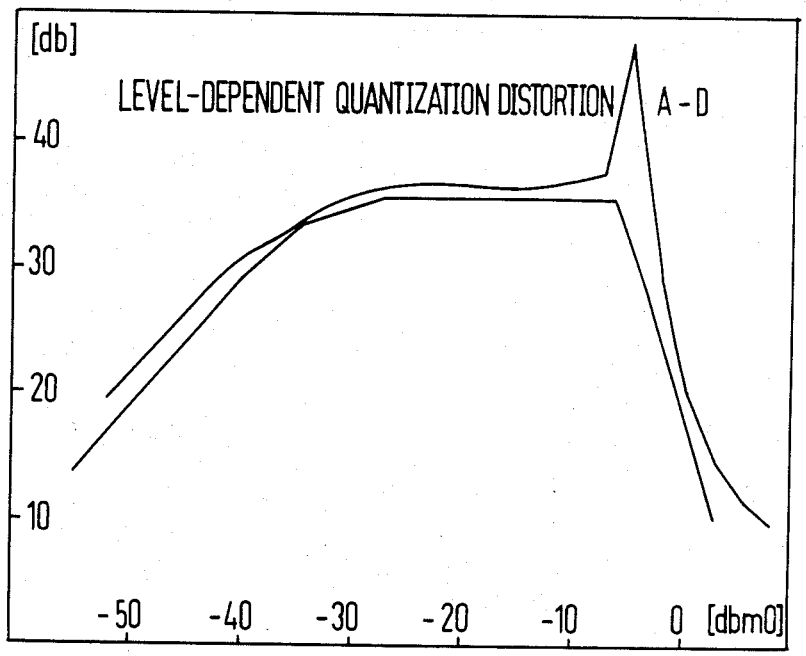

FIGS. 12 and 13 show the level-dependent attenuation distortion or, respectively, the level-dependent quantization distortion of, once again, the same codec, this time, however, for noise signals. In comparison to FIG. 10 or, respectively, FIG. 11, one can see that the fine structure of the curves is blurred as a result of the broader scatter of the probability distribution inherent in the noise signals. Although the curves illustrated in FIGS. 12 and 13 more extensively "describe" the codec than the corresponding curves for noise signals, it is useful to also illustrate these since, as a result, possibilities of comparison are given to the results of other measuring methods which likewise function with noise signals.

The arrangement illustrated in FIG. 2 serves for measuring a digital-to-analog converter or, respectively, a codec in the digital-to-analog direction. A digital word generator 10 is provided which supplies a word sequence which, for example, corresponds to the sampling values of a sinusoidal test signal whose frequency again exhibits the same relationship to the system sampling frequency as in the preceding description. The word sequence generated by the generator 10 is supplied to the digital input of the test specimen referenced 11. Its analog output is connected to the analog input of a standard coder referenced 12. Analogous to the arrangement according to FIG. 1, the digital output of the standard coder 12 is connected to a series-parallel converter 4 to which the same components or, respectively, devices are connected as given the arrangement according to FIG. 1. All circuit parts are again under the shared coordinating influence of a control means which is again referenced 9. The behavior of the standard coder 12 is expediently tested by means of an arrangement according to FIG. 1 and is subjected, if need be, to an error correction. FIG. 4 shows a corresponding arrangement. The generator referenced there with 13 overall is illustrated in detail in FIG. 3. It consists of a digital word generator 10 which is again referenced 10 and whose output leads to a digital-to-analog converter 14 which in turn controls a sinusoidal generator which is referenced 2, as in FIG. 1. The circuit arrangement illustrated in FIG. 3 guarantees an exact synchronization between the test signal and the sampling signal.

Given the arrangement according to FIG. 4, the (analog) output signal of the generator 10 can be selectively supplied by means of corresponding change-over means either to the analog input of the test specimen 3 or to the analog input of the standard coder 12. By so doing, the latter can be checked and be subjected to error monitoring. A line referenced 15 serves for inputting values of the digital word generator for the purpose of error correction. The values can be related to a calculated ideal curve for error elimination.

In the following, the functioning of the arrangement according to FIG. 4 is briefly described:

Given the illustrated switch position, the arrangement serves for checking the standard coder 12. It is treated just like the test specimen 3 in the arrangement according to FIG. 1. The result of this test is likewise grounds for a correction.

When the change-over means connected to the analog input of the standard coder 12 is actuated, the manner of functioning of the arrangement corresponds to that of FIG. 2. For the sake of clarity, the low-pass filter and sin x/x equalizer which are provided between the test specimen and the standard coder are not illustrated.

When the switch connected to the analog output of the generator 13 is actuated, the arrangement functions in the same manner as the test installation according to FIG. 1. The initially enumerated parameters of the test specimen illustrated by way of example in FIGS. 7 through 13 can be identified without great computational expense and in a very short time on the basis of the data deposited in the store. In order to be independent of special starting conditions and in order to be able to execute the measurement in the steady-state condition, the analysis of the digital words can, for example, be carried out in the following manner. In the memory 5, the computer 7 identifies the first occurrence of the digital word describing the highest amplitude value. This value is viewed as the crest of the (sinusoidal) signal. Based on the given, fixed interrelationship between the sampling frequency and the test frequency, a search is subsequently carried out for the digital word describing the smallest amplitude value. When the test specimen is not overdriven and given the assumption that its offset error is equal to zero, the digital word describing the smallest amplitude value must appear at an argument value which is phase-shifted by $\pi/2$ in comparison to the argument value for the highest amplitude value. Proceeding from this argument value, the actual position of the zero-axis crossing is identified. The offset error can be determined from this and from the position of the digital word describing the maximum amplitude value having a negative operational sign, so that the characteristic points for the curve illustrated in FIG. 6 or, respectively, FIG. 9 are fixed.

In conclusion, let a few aspects of the inventive method be briefly summarized once again.

All test values are determined in the steady-state condition of the test specimen and can be derived from a single measurement. However, it can be advantageous for practical reasons to employ a plurality instead of only one test signal having an amplitude corresponding to the modulation limit of the test specimen.

The measuring time is short; for the values of the sampling and test frequency specified above, it characteristically amounts to approximately 1 to a maximum of 2 seconds. Given a suitable format of the test installation, one respective test procedure can be processed during the time the next samples are being obtained.

The signal response of the test specimen arises, so to speak, "stroboscopically". As a result, as many test points having a defined chronological position in the interesting range as desired can be identified and, thus, any desired resolution can be achieved.

Since all calculations are executed with mathematical operations such as are known for the given, preferably sinusoidal test signal, the computational treatment is extremely simplified in comparison to the fast Fourier transformation. Due to the precise chronological allocation, it is necessary to proceed from probability densities only given the calculation of the quantization distortion.

When the diagram illustrated in FIG. 9 is composed of the signal samples gained during the test time of, for example, one or 2 seconds, a resolution of, for example, 0.0125% derives given a sampling rate of 80 kHz. Such a high resolution, however, is required at most in the proximity of the zero-axis crossing whereas the number of samples to be investigated for the computational treatment can be drastically reduced in the area of the highest amplitude, i.e., in the proximity of the modulation limit.

The method according to the invention is suitable not only for testing analog-to-digital and/or digital-to-analog converters, but is also suitable for checking overall installations which, in addition to the converters, contain further active and/or passive transmission elements or line sections. It is also possible to separately check such elements or line sections when the behavior of the converters is known or, respectively, has been previously separately identified.

Differing from the methods which are currently standard, the images "level-dependent attenuation distortion" and "quantization distortion" given the inventive method derive as a quasi-closed curved line which consists of 127 connected points instead of, for example, 10 or 12 test points which are connected to one another by straight lines without, however, actually representing the intervening course of the attenuation. In comparison to the methods previously practiced, however, the time required for producing the diagrams nonetheless lies at approximately 1/100. The required synchronization can also ensue computationally when the test signal and clock source are monitored by a frequency meter.

Although various changes and modifications might be proposed by those skilled in the art, it will be understood that we wish to include within the claims of the patent warranted hereon all such changes and modifications as reasonably come within our contribution to the art.

We claim:

1. A method for checking test specimens comprising analog-to-digital converters or telecommunications transmission links which contain such converters or are connected in series thereto, comprising the steps of:
   (a) generating an analog periodic test signal and selecting its period in comparison to a sampling period on which digitization is based such that all sampling times lying within a predetermined test time span extending over a plurality of periods of the test signal occupy predetermined different relative time positions within a period interval of the test signal;
(b) supplying the analog test signal to an analog input of the test specimen, the test specimen having as a response at its output digital signal samples during the predetermined test time span which all correspond to different argument values of the test signal;
(c) depositing in a store at least a part of digital words forming said digital signal samples; and
(d) determing an actual transfer characteristic of the test specimen by
(i) sorting the stored digital words in accordance with their relative time position within the period interval of the test signal,
(ii) compiling amplitude values corresponding to the digital words to form a curve representing a signal response of the test specimen to the test signal, and
(iii) comparing the curve with a curve of the original test signal.

2. A method according to claim 1 including the step of synchronizing generation of the test signal, sampling of the test specimen, and depositing of the digital words in the store from a shared clock source.

3. A method according to claim 1 including the step of identifying level-dependent attenuation distortion of the test specimen from the transfer characteristic of said test specimen.

4. A method according to claim 1 including the step of identifying level-dependent quantization distortion of the test specimen from the transfer characteristic of said test specimen.

5. A method according to claim 1 wherein the test signal is sinusoidal.

6. A method for checking test specimens comprising digital-to-analog converters or telecommunications transmission links which contain such converters or are connected in series thereto, comprising the steps of:
(a) generating a digital periodic test signal and selecting its period in comparison to a sampling period on which digitalization is based such that all sampling times lying within a predetermined test time span extending over a plurality of periods of the test signal occupy predetermined different relative time positions within a period interval of the test signal;
(b) supplying the digital test signal to a digital input of the test specimen;
(c) supplying an analog response from an output of the test specimen to a standard coder which as a response at its output supplies digital signal samples during the predetermined test time span which all correspond to different argument values of the test signal;
(d) depositing in a store at least a part of digital words forming said digital signal samples of the standard coder; and
(e) determining an actual transfer characteristic of the test specimen by
(i) sorting the stored digital words in accordance with their relative time position within the period interval of the test signal,
(ii) compiling amplitude values corresponding to the digital words to form a curve representing a signal response of the test specimen to the test signal, and
(iii) comparing this curve with the curve of the original test signal.

7. A method according to claim 6 including the step of synchronizing generation of the test signal, sampling of the test specimen, and inscribing the digital words in the store from a shared clock source.

8. A method according to claim 6 including the step of identifying level-dependent attenuation distortion of the test specimen from the transfer characteristic of said test specimen.

9. A method according to claim 6 including the step of identifying level-dependent quantization distortion of the test specimen from the transfer characteristic of said test specimen.

10. A method according to claim 6 including the step of providing a digital word generator for input of digital words to the test specimen as the test signal.

11. A system for checking test specimens comprising analog-to-digital converters or telecommunications transmission links which contain such converters or are connected in series thereto, comprising:
(a) means for generating an analog periodic test signal and selecting its period in comparison to a sampling period on which digitization is based such that all sampling times lying within a predetermined test time span extending over a plurality of periods of the test signal occupy predetermined different relative time positions within a period interval of the test signal;
(b) means for supplying the analog test signal to an analog input of the test specimen, the test specimen having as a response at its output digital signal samples during the predetermined test time span which all correspond to different argument values of the test signal;
(c) a store;
(d) means for depositing in the store at least a part of digital words forming said digital signal samples; and
(e) means for determining an actual transfer characteristic of the test specimen by
(i) sorting the stored digital words in accordance with their relative time position within the period interval of the test signal,
(ii) compiling amplitude values corresponding to the digital words to form a curve representing a signal response of the test specimen to the test signal, and
(iii) comparing the curve with a curve of the original test signal.

12. A system according to claim 11 wherein said means for generating includes a signal generator which controls a sampling generator and a test signal generator and provides synchronization of the two generators.

13. A system according to claim 11 wherein the store has a series-to-parallel converter associated therewith.

14. A system for checking test specimens comprising digital-to-analog converters or telecommunications transmission links which contain such converters or are connected in series thereto, comprising:
(a) means for generating a digital periodic test signal and selecting its period in comparison to a sampling period on which digitization is based such that all sampling times lying within a predetermined test time span extending over a plurality of periods of the test signal occupy predetermined different relative time positions within a period interval of the test signal;

(b) means for supplying the digital test signal to a digital input of the test specimen;

(c) a standard coder;

(d) means for supplying an analog response from an output of the test specimen to the standard coder and which as a response at its output supplies digital signal samples during the predetermined test time span which all correspond to different argument values of the test signal;

(e) a store;

(f) means for depositing in the store at least a part of digital words forming said digital signal samples of the standard coder; and (g) means for determining an actual transfer characteristic of the test specimen by
  (i) sorting the stored digital words in accordance with their relative time position within the period interval of the test signal,
  (ii) compiling amplitude values corresponding to the digital words to form a curve representing a signal response of the test specimen to the test signal, and
  (iii) comparing this curve with the curve of the original test signal.

15. A system according to claim 14 wherein the means for generating a digital periodic test signal comprises a digital word generator connected to the digital input of the test specimen.

16. A system according to claim 14 wherein the standard coder comprises an analog-to-digital converter.

17. A system according to claim 14 wherein said means for generating a digital test signal comprises a digital word generator means for generating a digital word sequence describing a test signal, its output being connected to the digital input of the test specimen; said standard coder comprising an analog-to-digital converter whose analog input is connected to the analog output of the test specimen; and the store including a series-parallel converter, said store being connected to a digital output of the standard coder.

18. A system according to claim 14 wherein the system is also designed for checking test specimens comprising analog-to-digital converters and wherein a switch means is provided so as to selectively connect a means for generating an analog periodic test signal to an analog input of an analog-to-digital converter test specimen, the switch means also isolating operation of the standard coder, and a connection being provided between a digital output of the test specimen and the store.

* * * * *